US012761257B2

(12) United States Patent
Rha et al.

(10) Patent No.: US 12,761,257 B2
(45) Date of Patent: Oct. 13, 2026

(54) RF CHARACTERISTIC MEASUREMENT METHOD AND SYSTEM

(71) Applicant: MILIWAVE CO., LTD., Gangwon-do (KR)

(72) Inventors: Seung Hyun Rha, Gyeonggi-do (KR); Yung Ha Han, Seoul (KR); Ho Sun Lee, Gyeonggi-do (KR)

(73) Assignee: MILIWAVE CO., LTD., Gangwon-do (KR)

( * ) Notice: Subject to any disclaimer, the term of this patent is extended or adjusted under 35 U.S.C. 154(b) by 226 days.

(21) Appl. No.: 18/713,759

(22) PCT Filed: Dec. 8, 2022

(86) PCT No.: PCT/KR2022/019892
§ 371 (c)(1),
(2) Date: May 28, 2024

(87) PCT Pub. No.: WO2023/113374
PCT Pub. Date: Jun. 22, 2023

(65) Prior Publication Data

US 2025/0027979 A1 Jan. 23, 2025

(30) Foreign Application Priority Data

Dec. 15, 2021 (KR) ........................ 10-2021-0179376

(51) Int. Cl.
*G01R 29/08* (2006.01)

(52) U.S. Cl.
CPC ................................ *G01R 29/0871* (2013.01)

(58) Field of Classification Search
CPC .. G01R 29/08; G01R 29/087; G01R 29/0871; G01R 23/02; H04B 17/00; H04B 17/10;
(Continued)

(56) References Cited

U.S. PATENT DOCUMENTS

2014/0087668 A1* 3/2014 Mow .................... H04B 17/318 455/67.14
2014/0282783 A1* 9/2014 Totten .................... H04N 21/61 725/111

(Continued)

FOREIGN PATENT DOCUMENTS

KR 10-2013-0096696 A 8/2013
KR 10-2015-0009969 A 1/2015

(Continued)

OTHER PUBLICATIONS

International Search Report from corresponding PCT Application No. PCT/KR2022/019892, dated Mar. 13, 2023.

*Primary Examiner* — Son T Le
(74) *Attorney, Agent, or Firm* — Harness, Dickey & Pierce, P.L.C.

(57) ABSTRACT

Disclosed is an RF characteristic measurement system comprising: a shield box in which a DUT accessing a network on mobile by using an access point antenna and an antenna module is provided, which receives an RF signal of the AP antenna; a test device for generating the RF signal to be transmitted to the DUT, and measuring the RF characteristic of the DUT by using an RF characteristic signal received from the DUT; and a control device for controlling the operation of the DUT and the operation of the test device, wherein the test device includes: an attenuator for adjusting the output power of the RF signal to be input into the DUT; a transmission/reception path separator, which is electrically connected to the AP antenna and separates transmitted/received RF signals from each other; and an AP board, which is electrically connected to the attenuator and the transmission/reception path separator.

14 Claims, 8 Drawing Sheets

(58) Field of Classification Search
CPC ................ H04B 17/19; H04B 17/0085; H04B 17/0087; H04B 17/101
See application file for complete search history.

(56) References Cited

U.S. PATENT DOCUMENTS

| | | | | |
|---|---|---|---|---|
| 2015/0256274 | A1* | 9/2015 | Olgaard ................ | H04B 17/24 455/67.14 |
| 2018/0102860 | A1 | 4/2018 | Emmanuel et al. | |

FOREIGN PATENT DOCUMENTS

| | | | |
|---|---|---|---|
| KR | 10-2016-0018573 | A | 2/2016 |
| KR | 10-2018-0011765 | A | 2/2018 |
| KR | 10-2021-0032133 | A | 3/2021 |

* cited by examiner

PRIOR ART

PRIOR ART

RF CHARACTERISTIC MEASUREMENT METHOD AND SYSTEM

CROSS-REFERENCE TO RELATED APPLICATIONS

This application is a national phase application of PCT Application No. PCT/KR2022/019892, filed on Dec. 8, 2022, which claims benefit of Korean Patent Application No. 10-2021-0179376, filed on Dec. 15, 2021. The entire disclosure of the applications identified in this paragraph are incorporated herein by references.

TECHNICAL FIELD

The present invention relates to a radio frequency (RF) characteristic measurement method and system, and more specifically, to a method of measuring RF characteristics of a device under test connected to a network via an AP, and a system using the same.

BACKGROUND ART

Institute of Electrical and Electronics Engineers (IEEE) 802.11 is a technology used in wireless computer networking for a wireless local area network, commonly called a WLAN or Wi-Fi, and refers to a standard developed by the eleventh working group of the IEEE LAN Standards Committee (IEEE 802).

IEEE 802.11 is a technology designed to complement for the drawbacks of Ethernet, the primarily used wired LAN form currently, and is widely employed to minimize unnecessary cabling work and maintenance costs at the end node of an Ethernet network.

In the case of an antenna system that includes an antenna, when the radio frequency (RF) characteristics of the antenna system are measured not by a radiation method but by a conduction method, an expensive measurement-specific antenna connector is used.

FIG. 1 is a diagram illustrating an example of measuring radio frequency (RF) characteristics of a device under test (DUT) using wireless local area network (LAN) measurement equipment according to a prior art.

In non-signaling mode, wireless LAN measurement equipment may measure the sensitivity of the device under test (DUT) for each modulation and coding scheme (MCS) while adjusting the level of a vector signal generator (VSG), and may measure an effective isotropic radiated power (EIRP) using a vector signal analyzer (VSA) of the equipment while transmitting the transmit (TX) power of the DUT with the MCS of the DUT fixed.

However, wireless LAN measurement equipment in non-signaling mode has a limitation in that it can measure RF characteristics at the physical layer but cannot measure throughput at the application layer.

Currently, there is no equipment that supports 60 GHz 801.11ay in signaling mode.

FIG. 2 is a diagram illustrating an example of measuring RF characteristics of a DUT using a 60 GHz access point (AP) according to a prior art.

Referring to FIG. 2, with a commercial 60 GHz 801.11ay AP, the throughput of the DUT may be measured. However, to measure the sensitivity point of a specific MCS, the distance between the DUT and the commercial 60 GHz 801.11ay AP must be physically varied, and the measurement should be conducted inside a shield room measuring 10 to 12 m.

Currently, commercially available 801.11ay devices support up to MCS12, with a maximum throughput of 4.62 GHZ. Therefore, both the DUT and the commercial 60 GHz 801.11ay AP must support at least USB 3.1 (5 Gbps) or 5G LAN external interface. In particular, there is an issue where an interface for testing needs to be added to the DUT, which may not be necessary for the product specifications of the DUT.

DETAILED DESCRIPTION

Technical Problem

An object to be achieved by the present invention is to provide a radio frequency (RF) characteristic measurement method and system for a 60 GHz access point (AP) function capable of measuring both the RF characteristics and throughput of a device under test.

An object to be achieved by the present invention is to provide an RF characteristic measurement method and system for measuring the RF characteristics of a device under test using a small-scale shield box based on simulation information regarding a shield room.

Technical Solution

A radio frequency (RF) characteristic measurement system according to an embodiment of the present invention may include a shield box in which an access point (AP) antenna and a device under test (DUT) accessing a network via a mobile connection using an antenna module configured to receive an RF signal of the AP antenna are provided; a testing apparatus configured to generate the RF signal to be transmitted to the DUT and measure RF characteristics of the DUT using an RF characteristic signal received from the DUT; and a control device configured to control the operation of the DUT and the operation of the test apparatus, which are necessary for measuring the RF characteristics of the DUT, wherein the testing apparatus includes: an attenuator configured to adjust an output power of the RF signal to be input to the DUT; a transmit/receive (TX/RX) path separator electrically connected to the AP antenna and configured to separate paths of the RF signal and the RF characteristic signal; and an AP board electrically connected to the attenuator and the TX/RX path separator and configured to operate as an AP for the DUT.

The RF characteristics may include RF characteristics such as frame error rate (FER), modulation coding scheme (MCS), and effective isotropic radiated power (EIRP) at the physical layer related to the DUT, as well as throughput at the application layer.

The testing apparatus may be configured to further include an optical communication interface for communication between the AP antenna and the attenuator and communication between the attenuator and the AP board.

The testing apparatus may be configured to further include a first interface for controlling the DUT and a second interface for controlling the DUT and the testing apparatus and the first interface and the second interface may be implemented as interfaces having a throughput less than a maximum throughput of supportable MCS, regardless of the maximum throughput of the supportable MCS.

The testing apparatus may be configured to measure the RF characteristics of the DUT by varying the output of the AP board using the attenuator to correspond to received signal strength indicator (RSSI) distribution based on simulation information regarding the RSSI distribution that changes according to relative positions and orientations between the DUT and a virtual AP placed in a virtual shield room.

The AP board may include a first memory configured to store a program of an RF characteristic measurement function and a first command related to execution of the program and a first processor configured to execute the first command, and when the first processor executes the first command, the AP board may be set to act as a client in RF characteristic measurement.

The DUT may include a second memory configured to store a station function activation command and a second processor configured to execute the command, and the DUT may be configured to activate a station function through automatic execution of the station function activation command by the second processor.

The second memory may be configured to pre-store service set identifier (SSID) information of the AP board and the DUT may be configured to automatically connect to the AP board with the SSID when an AP with the SSID is found through AP search by the second processor.

The second memory may be configured to store a program of an RF characteristic measurement function and a second command related to execution of the program, and when the DUT is connected to the AP board and the second processor executes the second command, the DUT may set to act as a server in RF characteristic measurement.

An RF characteristic measurement method according to an embodiment of the present invention includes the steps of establishing a network connection environment for a DUT using an AP board, connecting the DUT to a network using the AP board, and measuring RF characteristics of the DUT through a control process of the AP board which includes a memory configured to store a program of an RF characteristic measurement function and a processor capable of executing the program.

The step of establishing the network connection environment for the DUT may further include setting up an environment for automatic execution of the program of the RF characteristic measurement function on the DUT and the AP board, activating an AP function of the AP board including a system on a chip (SoC), and setting a target channel to be measured using the AP function.

The step of establishing the network connection environment for the DUT may further include equipping the DUT and the AP antenna within a shield box, connecting the AP antenna and the AP board to a programmable attenuator configured to adjust a transmit output power of the AP board, and establishing an internal communication line of a testing apparatus including the AP board and an external communication line between the AP antenna and the AP board using an optical communication interface.

The step of establishing the network connection environment for the DUT may further include establishing communication lines between the DUT and the AP board, and between the AP board and a control device, using interfaces having a throughput less than the maximum throughput of supportable MCS, regardless of the maximum throughput of the supportable MCS.

The step of connecting the DUT to the network may include automatically activating a station function of the DUT, establishing communication connection between the DUT and the AP board through SSID search, and executing the program of the RF characteristic measurement function pre-stored in the DUT to enable the DUT to act as a server in RF characteristic measurement.

The step of measuring the RF characteristics of the DUT may include measuring the RF characteristics at a physical layer of the DUT and throughput at an application layer.

The step of measuring the RF characteristics of the DUT may include retrieving throughput, FER, and MCS values reported from the DUT while varying a transmit output power of the AP board by adjusting an attenuation value of an attenuator connected to the AP board.

The step of measuring the RF characteristics of the DUT may include calculating EIRP of the DUT according to MCS of the DUT, based on a pre-calibrated RSSI value of the AP board.

The details of other embodiments are incorporated in "Mode for Invention" and accompanying "Drawings".

The advantages and/or features, and schemes of achieving the advantages and features of the present invention will be apparently comprehended by those skilled in the art based on the embodiments, which are detailed later in detail, together with accompanying drawings.

However, the present invention is not limited to the following embodiments but includes various applications and modifications. The embodiments will make the disclosure of the present invention complete, and allow those skilled in the art to completely comprehend the scope of the present invention. The present invention is only defined within the scope of accompanying claims.

Advantageous Effects

According to the present invention, both the RF characteristics and throughput of a device under test can be measured using an SoC AP board.

Additionally, the throughput measurement process of the DUT exceeding the maximum throughput via 60 GHz Wi-Fi can be controlled through a control device of an interface with a throughput lower than the maximum throughput.

Furthermore, based on simulation information regarding a shield room, the RF characteristics of the DUT can be measured using a small-scale shield box.

MODE FOR INVENTION

Figure 1:
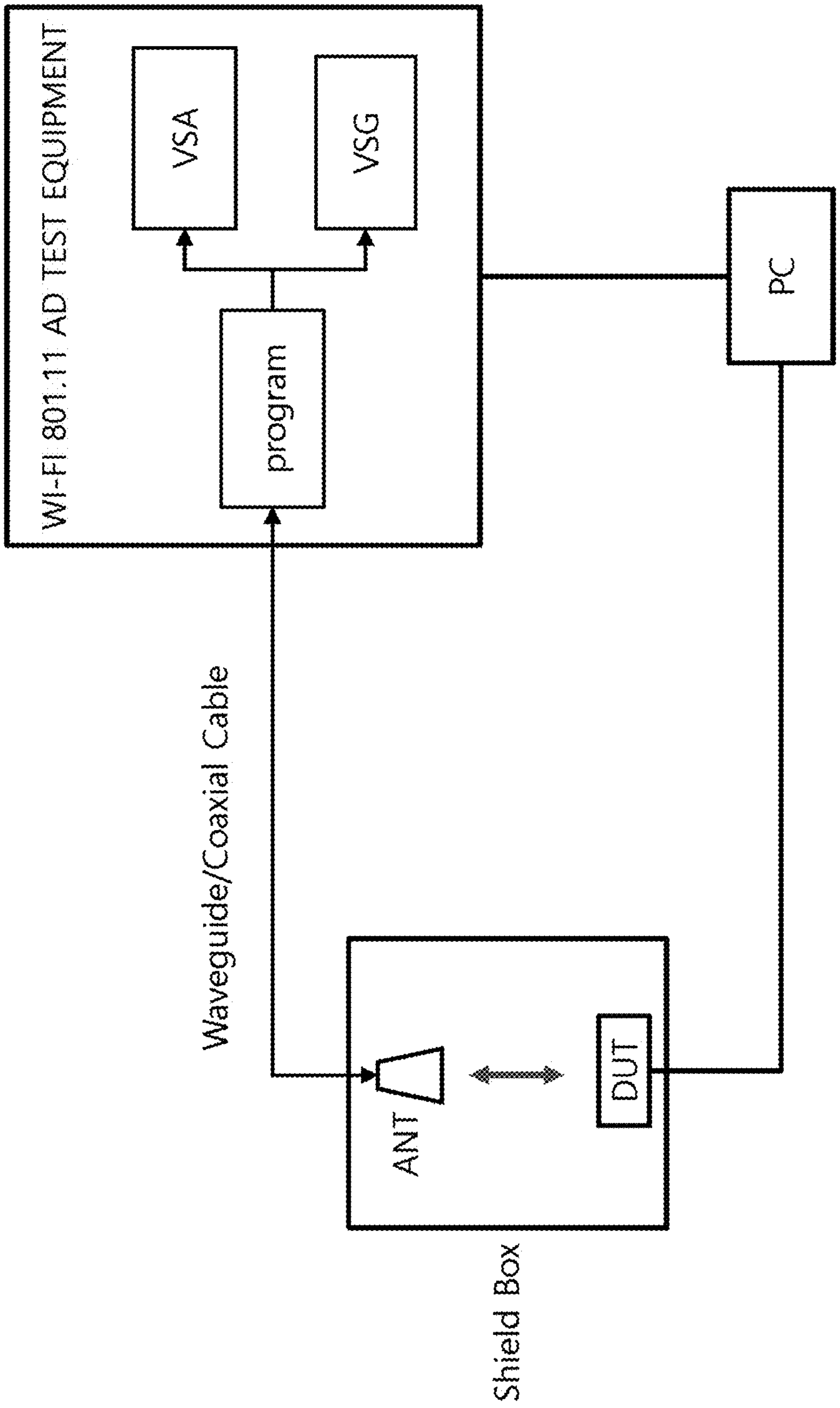
FIG. 1 is a diagram illustrating an example of measuring radio frequency (RF) characteristics of a device under test (DUT) using wireless local area network (LAN) measurement equipment according to a prior art.
Figure 2:
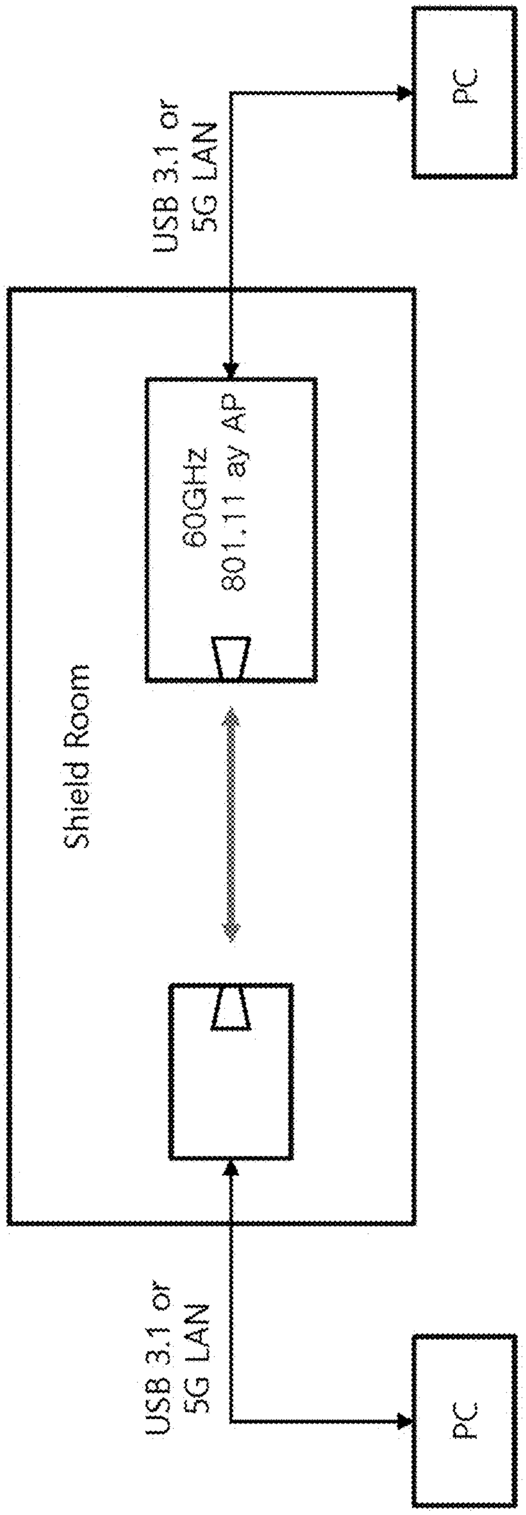
FIG. 2 is a diagram illustrating an example of measuring RF characteristics of a DUT using a 60 GHz access point (AP) according to a prior art.

Before describing the present invention in detail, terms and words used herein should not be construed as being unconditionally limited in a conventional or dictionary sense, and the inventor of the present invention can define and use concepts of various terms appropriately as needed in order to explain the present invention in the best way. Furthermore, it should be understood that these terms and words are to be construed in light of the meanings and concepts consistent with the technical idea of the present invention.

In other words, the terminology used herein is for the purpose of describing exemplary embodiments of the present invention, and is not intended to specifically limit the content of the present invention. It should be understood that these terms are defined terms in view of the various possibilities of the present invention.

Further, in this specification, the singular forms "a," "an," and "the" include plural referents unless the context clearly dictates otherwise. Also, it should be understood that the present invention can include a singular meaning even if it is similarly expressed in plural.

Where a component is referred to as "comprising" another component throughout this specification, unless specified otherwise, this means the component does not exclude any other element but may further include any other element.

Furthermore, when it is stated that an element is "inside or connected to another element," this element may be directly connected to another element or may be installed in contact with it. In addition, it may be installed spaced apart with a predetermined distance, and in the case where a component is installed to be spaced apart with a predetermined distance, a third component or means for fixing or connecting the component to another component may be present. Also, it should be noted that the description of the third component or means may be omitted.

On the other hand, it should be understood that there is no third component or means when an element is described as being "directly coupled" or "directly connected" to another element.

Likewise, other expressions that describe the relationship between the components, such as "between" and "right between," or "neighboring to" and "directly adjacent to" and such should be understood in the same spirit.

Further, in this specification, when terms such as "one surface," "other surface," "one side," "other side," "first," "second" and such are used, it is to clearly distinguish one component from another. It should be understood, however that the meaning of the component is not limited by such term.

It is also to be understood that terms related to positions such as "top," "bottom," "left," "right," and the like in this specification are used to indicate relative positions in the drawings for the respective components. Further, unless an absolute position is specified for these positions, it should not be understood that these position-related terms refer to absolute positions.

In addition, in this specification, the same reference numerals are used for the respective constituent elements of the drawings, and the same constituent elements are denoted by the same reference numerals even if they are shown in different drawings, that is, the same reference numerals indicate the same components throughout this specification.

It is to be understood that the size, position, coupling relationships and such, of each component constituting the present invention in the accompanying drawings, may be partially exaggerated or reduced or omitted to be able to sufficiently clearly convey the scope of the invention or for convenience of describing, and therefore the proportion or scale thereof may not be rigorous.

Also, in the following description of the present invention, a detailed description of a configuration that is considered to unnecessarily obscure the gist of the present invention, for example, a known technology including the prior art, may be omitted.

Hereinafter, embodiments of the present invention will be described in detail with reference to the accompanying drawings.

In describing a method according to an embodiment of the present invention, the term "data" may refer to a physical element containing binary code handled by a computer, while "information" may refer to the content element contained within the data. Therefore, data and information with a specific name can be used interchangeably to refer to the same subject.

Figure 3:
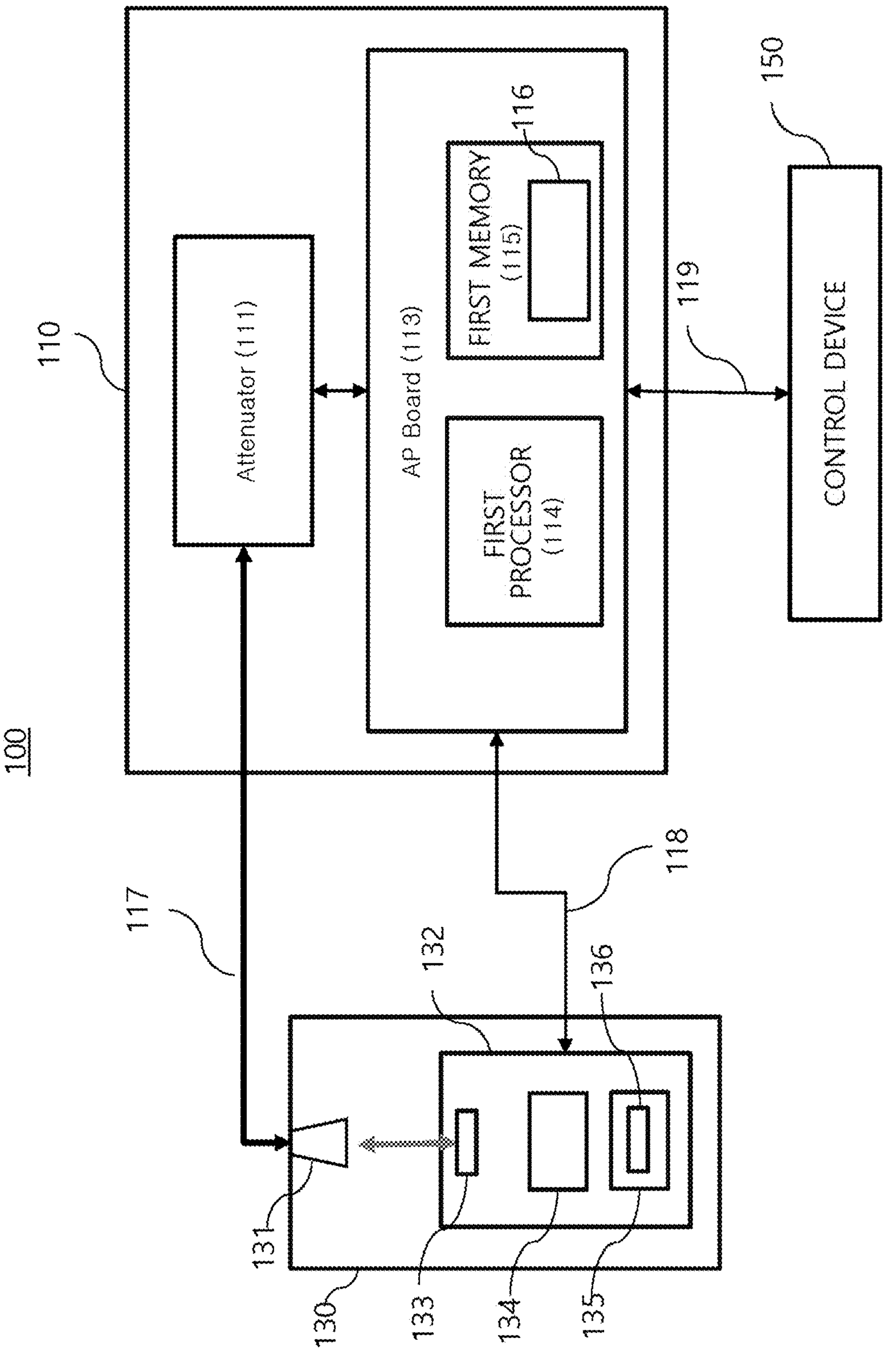
FIG. 3 is a block diagram illustrating an RF characteristic measurement system according to an embodiment of the present invention.

FIG. 3 is a block diagram illustrating an RF characteristic measurement system according to an embodiment of the present invention.

Referring to FIG. 3, an RF characteristic measurement system 100 may be configured to include a testing apparatus 110, a shield box 130 including an access point (AP) antenna 131 and a device under test (DUT) 132, and a control device 150 configured to adjust settings and control the operation of the measuring apparatus 110 and the DUT.

The testing apparatus 110 has a function of generating an RF signal to be transmitted to the DUT and measuring RF characteristics of the DUT using the RF signal received from the DUT.

Figure 4:
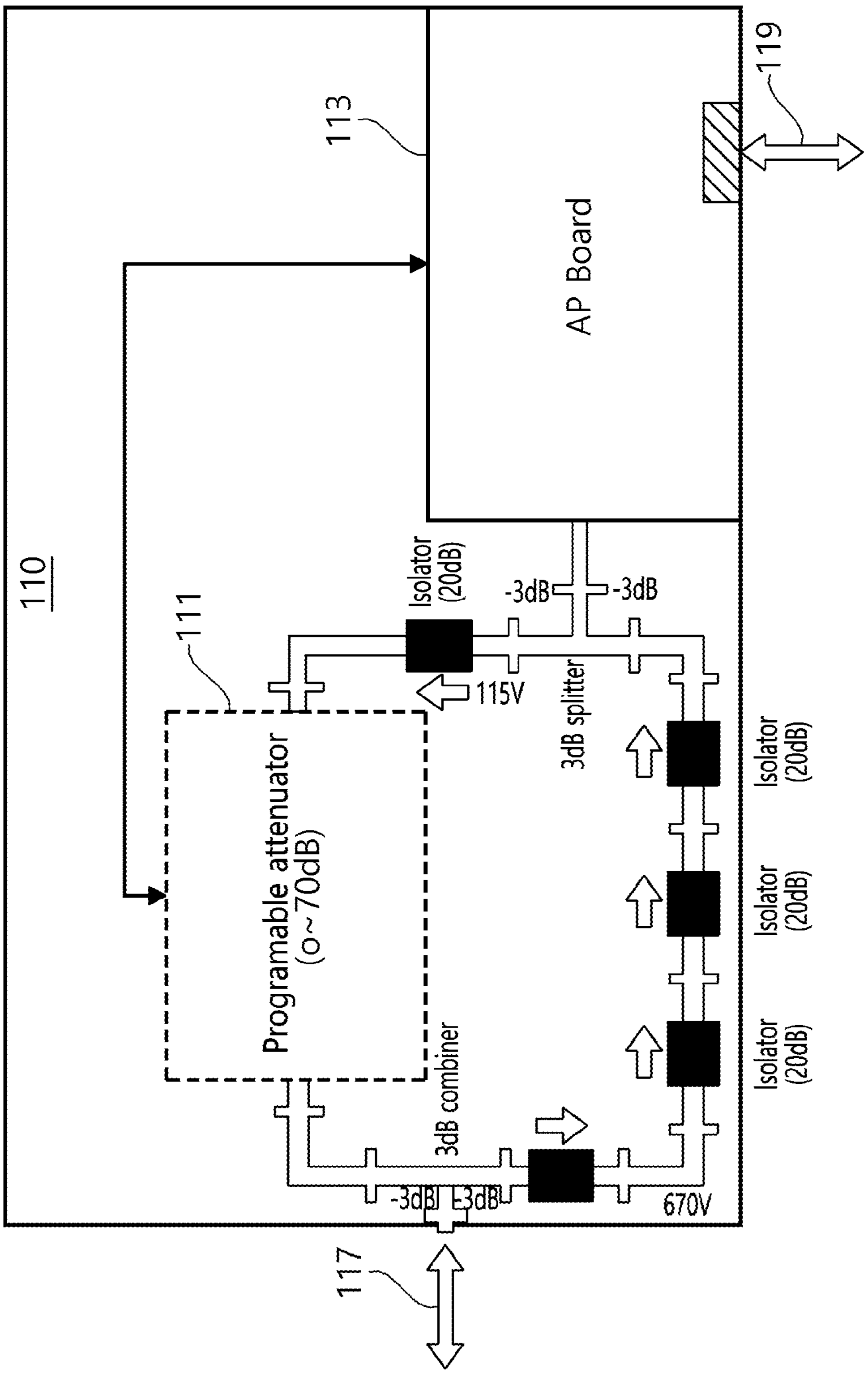
FIG. 4 is a block diagram illustrating a measuring apparatus according to an embodiment of the present invention.

FIG. 4 is a block diagram illustrating a measuring apparatus according to an embodiment of the present invention.

Referring to FIG. 4, the measuring apparatus 110 may be configured to include an attenuator 111 and an AP board 113.

The attenuator 111 has the function of adjusting the output power of the RF signal to be input to the DUT 132. The attenuator 111 may include a transmit/receive path separator (hereinafter, simply referred to as a "TX/RX separator"). The TX/RX separator has the function of separating the paths of the RF signal and RF characteristic signal.

The AP board 113 is electrically connected to the attenuator 111 and the TX/RX separator and may operate as an AP for the DUT 132.

Referring back to FIG. 3, the AP board 113 may be configured to include a first processor 114 and a first memory 115. The first processor 114 may take the form of a system-on-a-chip (SoC). The first memory 115 may store a program 116 of the RF characteristic measurement function and a first command related to its execution, and the first processor 114 may execute the program 116 of the RF characteristic measurement function through the execution of the first command. The first command includes an argument specifying the AP board 113 as a client, allowing the AP board 113 to function as a client in measuring the RF characteristics of the DUT.

The shield box 130 may be configured to include the AP antenna 131 and the DUT 132 accessing a network via a mobile connection using an antenna module 133 configured to receive an RF signal of the AP antenna.

Referring back to FIG. 3, the DUT 132 may be configured to include a second processor 134 and a second memory 135. The second processor 134 may take the form of an application processor with various functionalities integrated. The second memory 135 may store a program 136 of the RF characteristic measurement function and a second command related to its execution, and the second processor 134 may execute the program 136 of the RF characteristic measurement function through the execution of the second command. The second command includes an argument specifying the DUT 132 as a server, allowing the DUT 132 to function as a client in the RF characteristic measurement.

The second memory 135 of the DUT 132 may store a station function activation command. The second processor 134 may execute the activation command to automatically activate the station function of the DUT 132.

The DUT 132 may access the network 200 via the AP board 113. The second memory 135 may pre-store service set identifier (SSID) information of the AP board 113. The DUT 132 may be configured to automatically connect to the AP board 113 with the SSID when an AP with the SSID is found trough AP search by the second processor 134.

The network 200 may be any suitable communication network including wired and wireless networks, such as serial communication network, local area network (LAN), wide area network (WAN), the Internet, intranets, and extranets, as well as mobile networks, such as cellular networks, 3G networks, LTE networks, Wi-Fi networks, ad hoc networks, and combinations thereof.

The network 200 may include connections of network elements such as hubs, bridges, routers, switches, and gateways. The network 200 may include one or more connected networks, including public networks, such as the Internet, and private networks such as corporate intranets, for example, multiple network environments. Access to the network 200 can be provided through one or more wired or wireless access networks.

The control device 150 has the function of controlling the operation of the DUT 132 and the operation of the testing apparatus 110, which are necessary for measuring the RF characteristics of the DUT 132.

The testing apparatus 110 may be configured to include an optical communication interface 117 for communication between the AP antenna 131 and the attenuator 111 and communication between the attenuator 111 and the AP board 113, which are necessary for measuring the RF characteristics of the DUT 132.

The internal interface of the testing apparatus 110, which has a maximum throughput of 4.62 Gbps for the AP board 113 at 60 GHz, must support the maximum throughput of the AP board 113. Therefore, the interface between the internal interface of the testing apparatus 110 and the AP antenna 131 may be implemented as an optical communication interface 117, for example, using an optical fiber and a coaxial optical cable.

The external interface for controlling the DUT 132 and the testing apparatus 110 with a maximum throughput of 4.62 Gbps for the AP board 113 at 60 GHz should support at least USB 3.0 (5 Gbps) or a speed of 5G LAN or higher.

The testing apparatus 110 may be configured to further include a first interface 118 for controlling the DUT 132 and a second interface 119 for controlling the DUT 132 and the testing apparatus 110. The first interface 118 and the second interface 119 may be implemented as interfaces having a throughput less than the maximum throughput of supportable modulation and coding scheme (MCS), regardless of the maximum throughput. This is because the RF characteristic measurement program is automatically executed on the DUT 132 and the AP board 113 according to pre-settings, and the test is automatically performed accordingly.

The shield box 130 according to an embodiment of the present invention may be configured to include the AP antenna 131 and the DUT 132 within a smaller space compared to a general shield room. Therefore, directional information regarding the position and direction of the DUT 132 with respect to the AP antenna 131 within the shield box 130 is required to be additionally collected.

The testing apparatus 110 may be configured to measure the RF characteristics of the DUT 132 by varying the output of the AP board 113 using the attenuator 111 to correspond to received signal strength indicator (RSSI) distribution based on simulation information regarding the RSSI distribution that changes according to the relative positions and orientations between the DUT 132 and a virtual AP placed in a virtual shield room.

Figure 5:
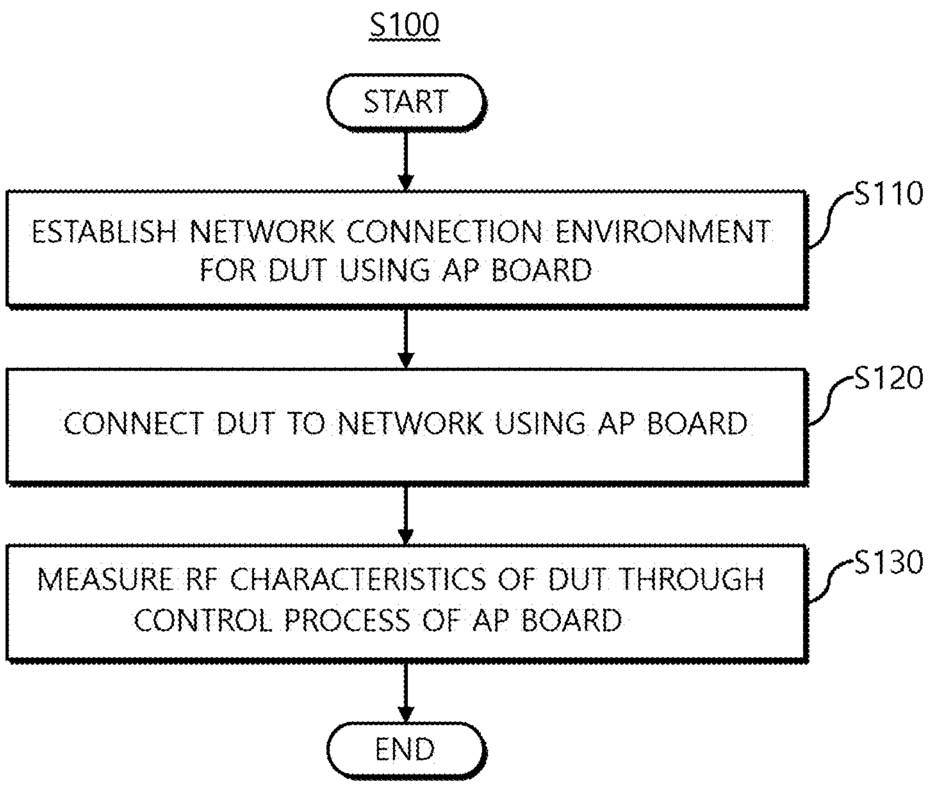
FIG. 5 is a flowchart illustrating an RF characteristic measurement method according to an embodiment of the present invention.

FIG. 5 is a flowchart illustrating an RF characteristic measurement method according to an embodiment of the present invention.

Referring to FIG. 5, an RF characteristic measurement method (S100) may include the steps of establishing a network connection environment for a DUT 132 using an AP board 113 (S110), connecting the DUT 132 to a network 200 using the AP board 113 (S120), and measuring the RF characteristics of the DUT 132 through the control process of the AP board 113 (S130). Here, RF characteristics include RF characteristics such as frame error rate (FER), modulation coding scheme (MCS), and effective isotropic radiated power (EIRP) at the physical layer related to the DUT 132, as well as throughput at the application layer.

Specifically, the network 200 connection environment for the DUT 132 may be established using the AP board 113 (S110). The DUT 132 may be connected to the network 200 via the AP board 113. The testing apparatus 110, in addition to the AP board 113, includes an attenuator 111, allowing a TX input power of the DUT 132 to be adjusted to various values using the attenuator 111. The AP board 113 may be placed separately from the DUT 132, and instead, the AP antenna 131 may be connected to the AP board 113 and placed within a shield box, which is a smaller space than a general shield room, along with the DUT 132.

The RF characteristic measurement system 100 may connect the DUT 132 to the network 200 using the AP board 113 (S120).

The RF characteristic measurement system 100 may measure the RF characteristics of the DUT 132 through the control process of the AP board 113, which includes a memory 115 configured to store a program of an RF characteristic measurement function and a processor 114 capable of executing the program (S130).

In the test, the AP board 113 functioning as a client and the DUT 132 functioning as the server may include their own processors and memory, so that the program of the RF characteristic measurement function is stored in each memory, and each processor is configured to execute the corresponding program using arguments appropriate for each role.

Figure 6:
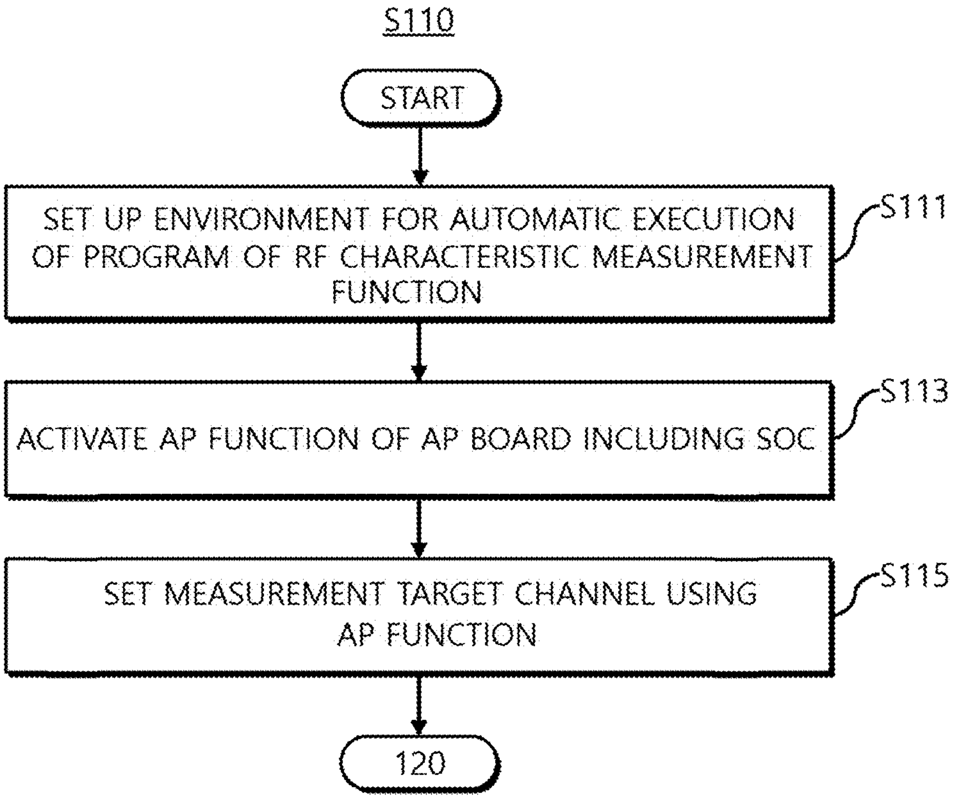
FIG. 6 is a flowchart illustrating the RF characteristic measurement method according to an embodiment of the present invention.

FIG. 6 is a flowchart illustrating the RF characteristic measurement method according to an embodiment of the present invention.

Referring to FIG. 6, the step S110 of establishing the network connection environment for the DUT may include setting up the environment for automatic execution of the program of the RF characteristic measurement function on the DUT 132 and the AP board 113 (S111), activating an AP function of the AP board 113 including a system on a chip (SoC) (S113), and setting a target channel to be measured using the AP function (S115).

Figure 7:
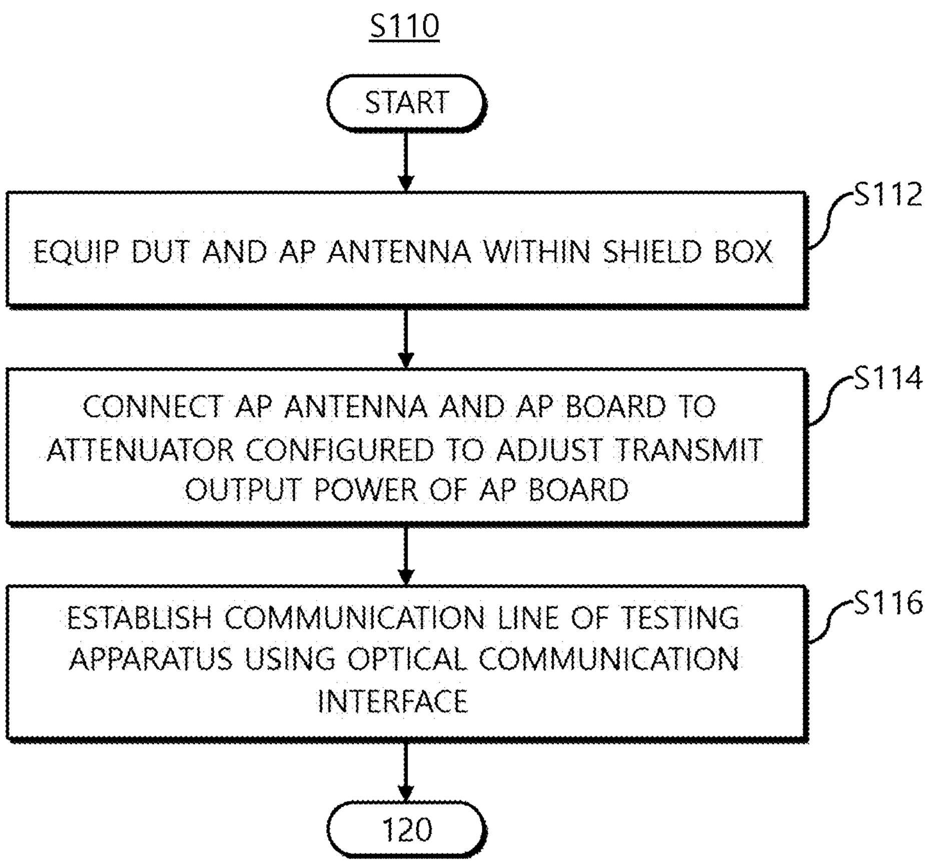
FIG. 7 is a flowchart illustrating the RF characteristic measurement method according to an embodiment of the present invention.

FIG. 7 is a flowchart illustrating the RF characteristic measurement method according to an embodiment of the present invention.

Referring to FIG. 7, the step S110 of establishing the network connection environment for the DUT may further include equipping the DUT 132 and the AP antenna 131 within a shield box (S112), connecting the AP antenna 131 and the AP board 113 to a programmable attenuator 111 configured to adjust a transmit (TX) output power of the AP board 113 (S114), and establishing an internal communication line of the testing apparatus 110 including the AP board 113 and an external communication line between the AP antenna 131 and the AP board 113 using an optical communication interface 117 (S116).

The step S110 of establishing the network connection environment for the DUT 132 may include establishing communication lines between the DUT 132 and the AP board 113, and between the AP board 113 and a control device 150, using interfaces having a throughput less than the maximum throughput of supportable MCS, regardless of the maximum throughput.

Figure 8:
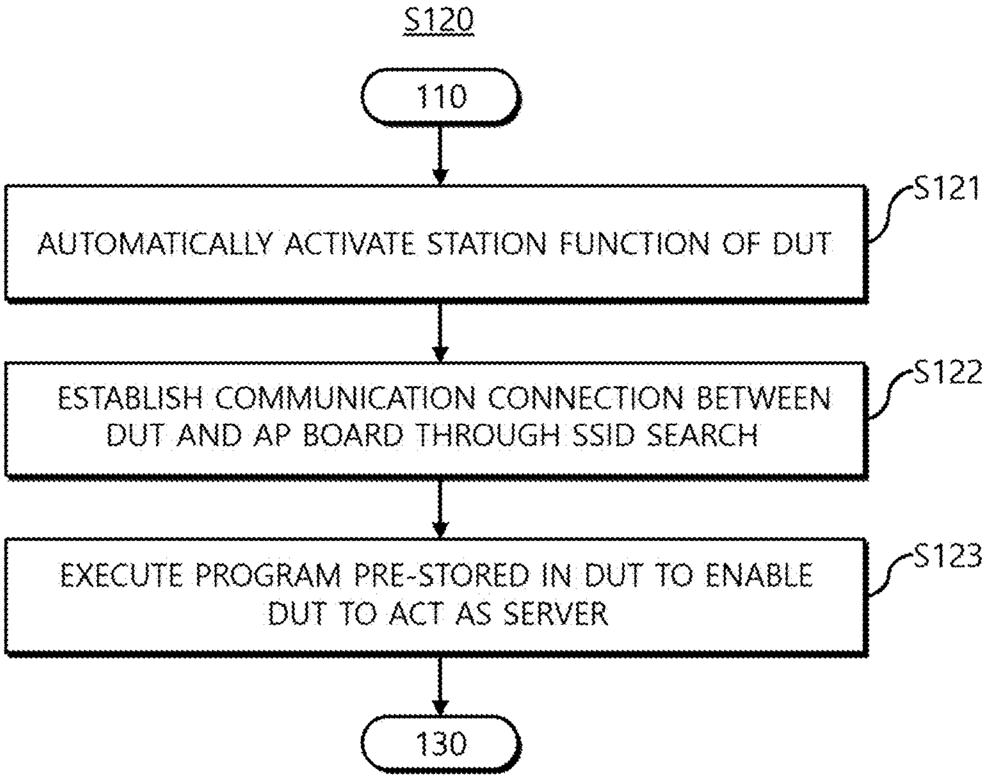
FIG. 8 is a flowchart illustrating an RF characteristic measurement method according to an embodiment of the present invention.

FIG. 8 is a flowchart illustrating an RF characteristic measurement method according to an embodiment of the present invention.

Referring to FIG. 8, the step S120 of connecting the DUT 132 to the network may include automatically activating a station function of the DUT 132 (S121), establishing communication connection between the DUT 132 and the AP board 113 through SSID search (S122), and executing the program of the RF characteristic measurement function pre-stored in the DUT 132 to enable the DUT 132 to act as a server in RF characteristic measurement (S123).

The step S130 of measuring the RF characteristics of the DUT 132 may include retrieving throughput, FER, and MCS values reported from the DUT 132 while varying the TX output power of the AP board 113 by adjusting the attenuation value of the attenuator 111 connected to the AP board 113.

The step of measuring the RF characteristics of the DUT 132 may further include calculating the EIRP of the DUT 132 according to the MCS of the DUT 132, based on the pre-calibrated RSSI value of the AP board 113. This process will be described in more detail below.

As a first process, an operating environment for a wireless LAN signal generator, such as a WiGig signal generator, is set up so that an EIRP of a specific level is output with a specific channel and a specific MCS.

As a second process, the AP board 113 is entered into RX test mode, and its channel is configured according to the channel set on the wireless LAN signal generator. At this time, the RSSI value reported from a receiver terminal of the AP board 113 is stored.

As a third process, the second process is repeated while the strength of the signal generated by the wireless LAN signal generator is gradually decreased in units of 1 dB and the settings are changed until the desired measurement range is reached.

As a fourth process, the first, second, and third processes are repeated while changing the desired channel and MCS, for example, from channel 1 to channel 6 and from MCS 0 to MCS 12.

As the final fifth process, the RSSI values corresponding to the EIRP for each channel and MCS are stored in a first memory 115 of the AP board 113.

As such, according to one embodiment of the present invention, both the RF characteristics and throughput of the DUT can be measured using an SoC AP board.

Additionally, the throughput measurement process of the DUT exceeding the maximum throughput via 60 GHz Wi-Fi can be controlled through a control device of an interface with a throughput lower than the maximum throughput.

Furthermore, based on simulation information regarding a shield room, the RF characteristics of the DUT can be measured using a small-scale shield box.

As described above, although exemplary embodiments of the present invention have been described, various embodiments disclosed in "Mode for Invention" are provided only for the illustrative purpose. Those skilled in the art can understand that various modifications, variations, and equivalents of the present invention are possible based on the above description.

In addition, since the present invention can be realized in various forms, the present invention is not limited to the above embodiments. The above description is provided only to allow those skilled in the art to perfectly understand the scope of the present invention, and those skilled in the art should know that the present invention is defined by the appended claims.

INDUSTRIAL APPLICABILITY

The present invention can be efficiently applied in the field of wireless communication technology.

What is claimed is:

1. A radio frequency (RF) characteristic measurement system comprising:

a shield box in which an access point (AP) antenna and a device under test (DUT) accessing a network via a mobile connection using an antenna module configured to receive an RF signal of the AP antenna are provided;

a testing apparatus configured to generate an RF signal to be transmitted to the DUT and measure RF characteristics of the DUT using an RF characteristic signal received from the DUT; and a control device configured to control an operation of the DUT and an operation of the testing apparatus, which are necessary for measuring the RF characteristics of the DUT, wherein the testing apparatus comprises:

an attenuator configured to adjust an output power of the RF signal to be input to the DUT; and an AP board electrically connected to the attenuator and configured to operate as an AP for the DUT, wherein the testing apparatus further comprises an optical communication interface for communication between the AP antenna and the attenuator and communication between the attenuator and the AP board, and wherein the testing apparatus further comprises a first interface for controlling the DUT and a second interface for controlling the DUT and the testing apparatus and the first interface and the second interface are implemented as interfaces having a throughput less than a maximum throughput of supportable modulation coding scheme (MCS), regardless of the maximum throughput of the supportable MCS.

2. The RF characteristic measurement system of claim 1, wherein the RF characteristics comprise frame error rate (FER), modulation coding scheme (MCS), and effective isotropic radiated power (EIRP) at a physical layer related to the DUT, as well as throughput at an application layer.

3. The RF characteristic measurement system of claim 1, wherein the testing apparatus is configured to measure the RF characteristics of the DUT by varying the output of the AP board using the attenuator to correspond to received signal strength indicator (RSSI) distribution based on simulation information regarding the RSSI distribution that changes according to relative positions and orientations between the DUT and a virtual AP placed in a virtual shield room.

4. The RF characteristic measurement system of claim 1, wherein the AP board comprises a first memory configured to store a program of an RF characteristic measurement function and a first command related to execution of the program; and a first processor configured to execute the first command, and when the first processor executes the first command, the AP board is set to act as a client in RF characteristic measurement.

5. The RF characteristic measurement system of claim 1, wherein the DUT comprises a second memory configured to store a station function activation command; and a second processor configured to execute the command and the DUT is configured to activate a station function through automatic execution of the station function activation command by the second processor.

6. The RF characteristic measurement system of claim 5, wherein the second memory pre-stores service set identifier (SSID) information of the AP board and the DUT is configured to automatically connect to the AP board with the SSID when an AP with the SSID is found through AP search by the second processor.

7. The RF characteristic measurement system of claim 6, wherein the second memory is configured to store a program of an RF characteristic measurement function and a second command related to execution of the program, and when the DUT is connected to the AP board and the second processor executes the second command, the DUT is set to act as a server in RF characteristic measurement.

8. A radio frequency (RF) characteristic measurement method performed by an RF characteristic measurement system, comprising the steps of:

establishing a network connection environment for a device under test (DUT) using an access point (AP) board;

connecting the DUT to a network using the AP board; and measuring RF characteristics of the DUT through a control process of the AP board which comprises a memory configured to store a program of an RF characteristic measurement function and a processor capable of executing the program, wherein the step of establishing the network connection environment for the DUT comprises establishing communication lines between the DUT and the AP board, and between the AP board and a control device, using interfaces having a throughput less than a maximum throughput of supportable modulation and coding scheme (MCS), regardless of the maximum throughput of the supportable MCS.

9. The RF characteristic measurement method of claim 8, wherein the step of establishing a network connection environment for the DUT comprises:

setting up an environment for automatic execution of the program of the RF characteristic measurement function on the DUT and the AP board;

activating an AP function of the AP board including a system on a chip (SoC); and setting a target channel to be measured using the AP function.

10. The RF characteristic measurement method of claim 8, wherein the step of establishing the network connection environment for the DUT comprises:

equipping the DUT and the AP antenna within a shield box;

connecting the AP antenna and the AP board to a programmable attenuator configured to adjust a transmit output power of the AP board; and establishing an internal communication line of a testing apparatus including the AP board and an external communication line between the AP antenna and the AP board using an optical communication interface.

11. The RF characteristic measurement method of claim 8, wherein the step of connecting the DUT to the network comprises:

automatically activating a station function of the DUT;

establishing communication connection between the DUT and the AP board through service set identifier (SSID) search; and executing the program of the RF characteristic measurement function pre-stored in the DUT to enable the DUT to act as a server in RF characteristic measurement.

12. The RF characteristic measurement method of claim 8, wherein the step of measuring the RF characteristics of the DUT comprises measuring the RF characteristics at a physical layer of the DUT and throughput at an application layer.

13. The RF characteristic measurement method of claim 8, wherein the step of measuring the RF characteristics of the DUT comprises retrieving throughput, frame error rate (FER), and MCS values reported from the DUT while varying a transmit output power of the AP board by adjusting an attenuation value of an attenuator connected to the AP board.

14. The RF characteristic measurement method of claim 8, wherein the step of measuring the RF characteristics of the DUT comprises calculating effective isotropic radiated power (EIRP) of the DUT according to MCS of the DUT, based on a pre-calibrated received signal strength indicator (RSSI) value of the AP board.

* * * * *